(12) United States Patent
Handa et al.

(10) Patent No.: US 11,509,886 B2
(45) Date of Patent: Nov. 22, 2022

(54) PHOTOELECTRIC CONVERSION DEVICE AND PHOTOELECTRIC CONVERSION SYSTEM

(71) Applicant: CANON KABUSHIKI KAISHA, Tokyo (JP)

(72) Inventors: Yoichiro Handa, Tokyo (JP); Yoichi Wada, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 16/727,482

(22) Filed: Dec. 26, 2019

(65) Prior Publication Data

US 2020/0228793 A1 Jul. 16, 2020

(30) Foreign Application Priority Data

Jan. 10, 2019 (JP) .............................. JP2019-002381

(51) Int. Cl.
*H01L 27/146* (2006.01)
*H04N 17/00* (2006.01)
*H04N 5/357* (2011.01)
*G01C 3/08* (2006.01)

(52) U.S. Cl.
CPC ........... *H04N 17/002* (2013.01); *G01C 3/085* (2013.01); *H01L 27/14612* (2013.01); *H01L 27/14636* (2013.01); *H01L 27/14643* (2013.01); *H04N 5/3575* (2013.01)

(58) Field of Classification Search
CPC ................. H01L 27/14612; H01L 27/14643
See application file for complete search history.

(56) References Cited

U.S. PATENT DOCUMENTS

| | | | |
|---|---|---|---|
| 8,885,082 B2 | 11/2014 | Noda |
| 8,921,855 B2 | 12/2014 | Okita |
| 9,172,951 B2 | 10/2015 | Okita |
| 9,538,112 B2 | 1/2017 | Wada |
| 9,596,426 B2 | 3/2017 | Handa |
| 9,906,747 B2 | 2/2018 | Araoka |
| 10,187,601 B2 | 1/2019 | Araoka |
| 2009/0066793 A1 | 3/2009 | Takeda |

(Continued)

FOREIGN PATENT DOCUMENTS

| | | |
|---|---|---|
| JP | 2006-140666 | 6/2006 |
| JP | 2012-199913 | 10/2012 |

(Continued)

*Primary Examiner* — Thanh Luu
(74) *Attorney, Agent, or Firm* — Venable LLP (57) ABSTRACT

A photoelectric conversion device includes a first pixel including a photoelectric converter, a first node to which charge is transferred from the photoelectric converter, and a first transistor that resets a voltage of the first node, and configured to output a first signal in accordance with a voltage of the first node, a second pixel including a second node to which a predetermined voltage is supplied and a second transistor that resets a voltage of the second node, and configured to output a second signal in accordance with a voltage of the second node; and a control line connected to the first transistor and the second transistor. The first transistor resets the first node to a first voltage, and the second transistor resets the second node to a second voltage having a smaller amplitude than the first voltage.

20 Claims, 8 Drawing Sheets

(56) References Cited

U.S. PATENT DOCUMENTS

| | | | |
|---|---|---|---|
| 2012/0228609 A1 | 9/2012 | Okita | |
| 2014/0027617 A1* | 1/2014 | Amikawa | H01L 27/14806 |
| | | | 257/229 |
| 2015/0008493 A1* | 1/2015 | Ni | H01L 27/14643 |
| | | | 257/292 |
| 2015/0077570 A1 | 3/2015 | Okita | |
| 2017/0212221 A1 | 7/2017 | Goden | |
| 2018/0197907 A1 | 7/2018 | Wada | |
| 2018/0374886 A1 | 12/2018 | Iwata | |
| 2019/0018408 A1* | 1/2019 | Gulati | G08G 1/09623 |
| 2020/0014914 A1* | 1/2020 | Chua | H04N 5/3696 |

FOREIGN PATENT DOCUMENTS

| | | |
|---|---|---|
| JP | 2018-93326 | 6/2018 |
| JP | 2018-113521 | 7/2018 |
| WO | 2006/120815 | 11/2006 |

* cited by examiner

FRONT VIEW

FIG. 6C

TOP VIEW

FIG. 6D

BACK VIEW

FIG. 7

PHOTOELECTRIC CONVERSION DEVICE AND PHOTOELECTRIC CONVERSION SYSTEM

BACKGROUND OF THE INVENTION

Field of the Invention

The present invention relates to a photoelectric conversion device and a photoelectric conversion system.

Description of the Related Art

In recent years, reduction in the size and improvement of reliability of a photoelectric conversion device have been demanded. In particular, in an on-vehicle use or the like, because a use environment is severe and safety measures are extremely important, a photoelectric conversion system having a failure detection function is demanded to address a function safety. Accordingly, it is required that a system for failure detection be also embedded in a photoelectric conversion device.

International Publication No. WO2006/120815 discloses a photoelectric conversion device that outputs a signal from a pixel configured to generate a reference signal via at least a part of the transmission path used for transmitting a signal from a pixel configured to generate a signal in accordance with the amount of an incident light and performs detection of a failure such as an anomaly of a transmission path based on an output reference signal. Further, Japanese Patent Application Laid-Open No. 2012-199913 discloses a photoelectric conversion device having a signal receiving unit test circuit that performs a test of a column readout circuit.

However, when a pixel used for failure detection has a defect or when deterioration due to a use occurs, an appropriate decision signal cannot be output from the pixel used for failure detection, and an error in a failure decision may occur.

SUMMARY OF THE INVENTION

The present invention intends to provide a photoelectric conversion device and a photoelectric conversion system that may reduce an error in a failure decision due to a defect or deterioration of a pixel used for failure detection.

According to one aspect of the present invention, provided is a photoelectric conversion device including a first pixel including a photoelectrical conversion unit, a first node to which charge is transferred from the photoelectric converter, and a first transistor that resets a voltage of the first node, and configured to output a first signal in accordance with a voltage of the first node, a second pixel including a second node to which a predetermined voltage is supplied and a second transistor that resets a voltage of the second node, and configured to output a second signal in accordance with a voltage of the second node, and a control line connected to the first transistor and the second transistor, wherein the first transistor resets the first node to a first voltage, and wherein the second transistor resets the second node to a second voltage having a smaller amplitude than the first voltage.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
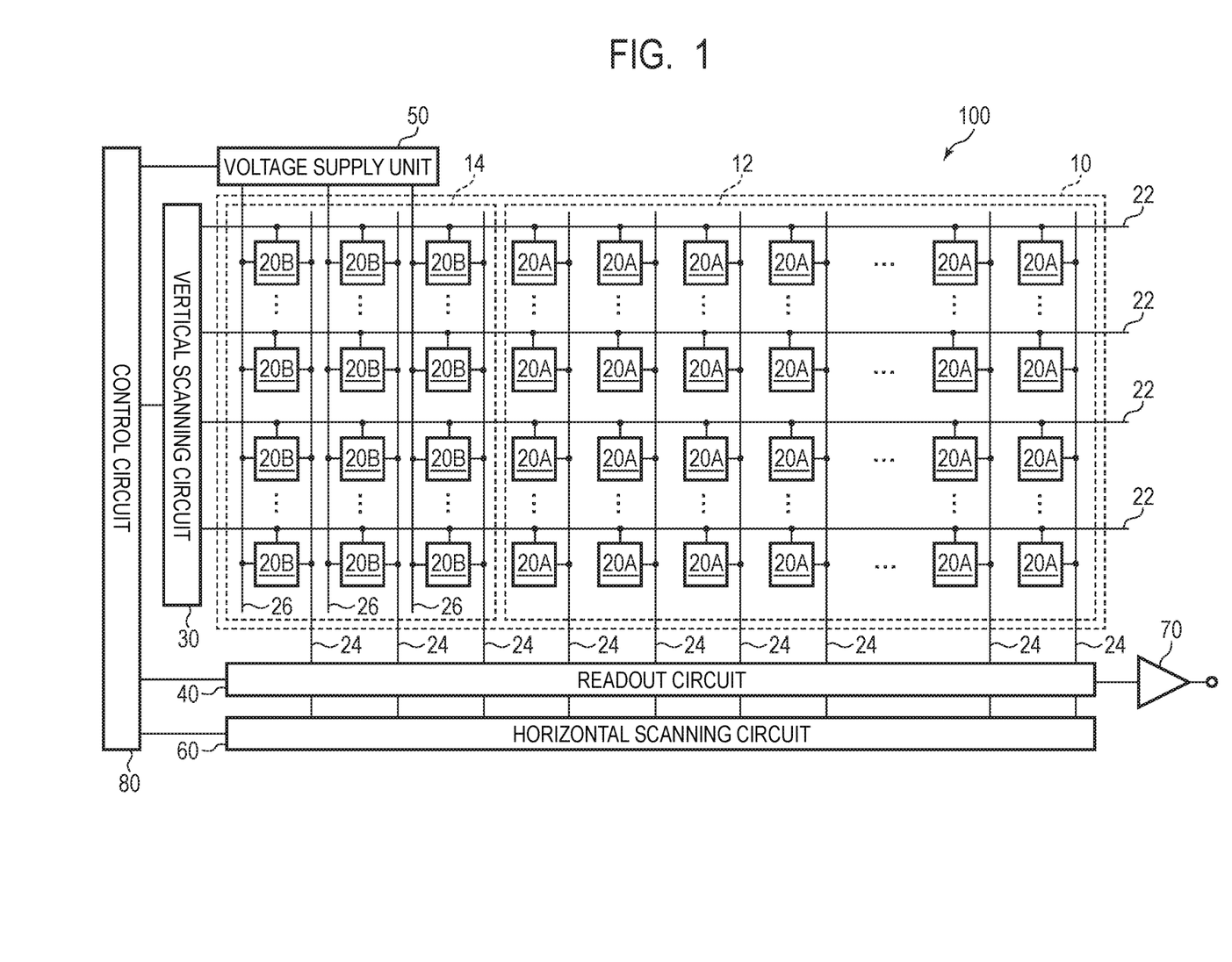
FIG. 1 is a block diagram illustrating a general configuration of a photoelectric conversion device according to a first embodiment of the present invention.
Figure 2:
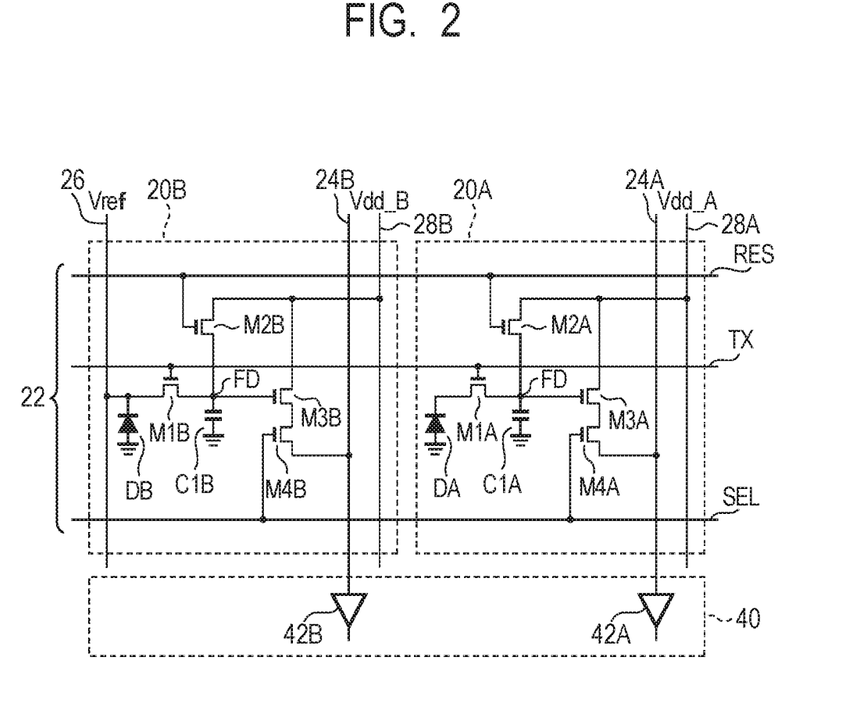
FIG. 2 is a circuit diagram illustrating a configuration example of pixels of the photoelectric conversion device according to the first embodiment of the present invention.
Figure 3:
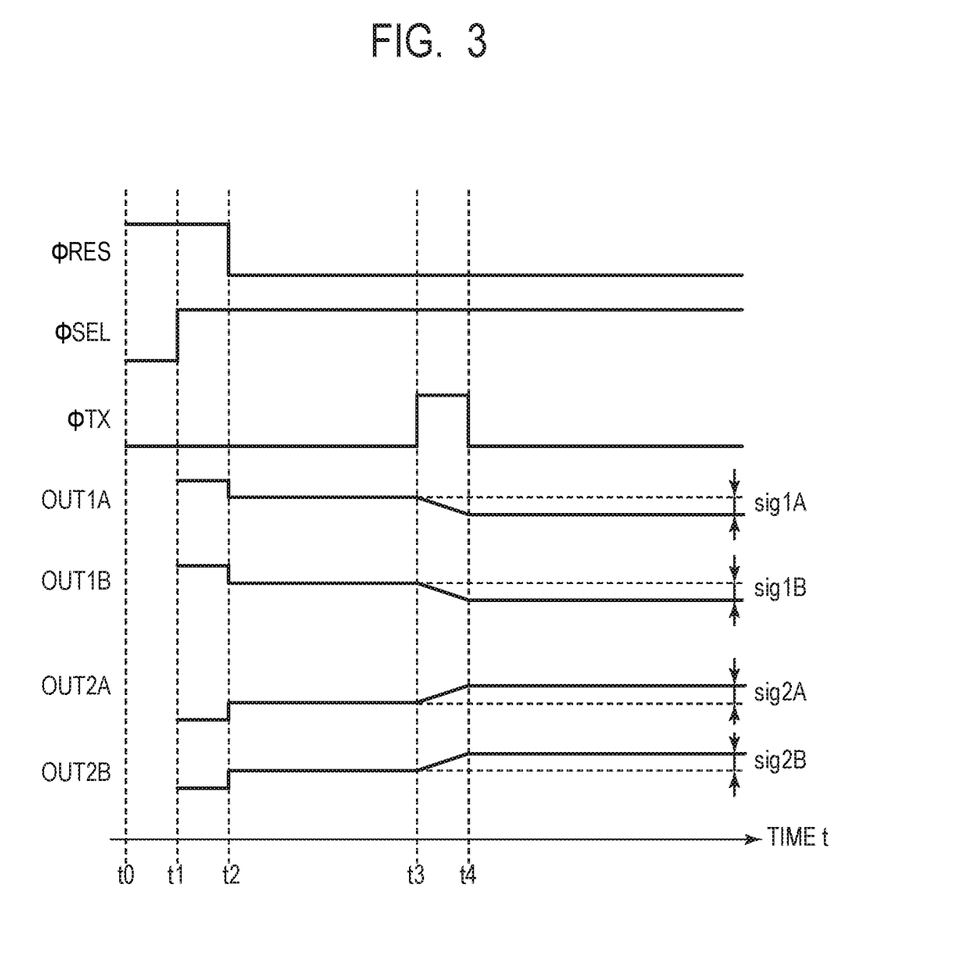
FIG. 3 is a timing diagram illustrating a method of driving the photoelectric conversion device according to the first embodiment of the present invention.
Figure 4:
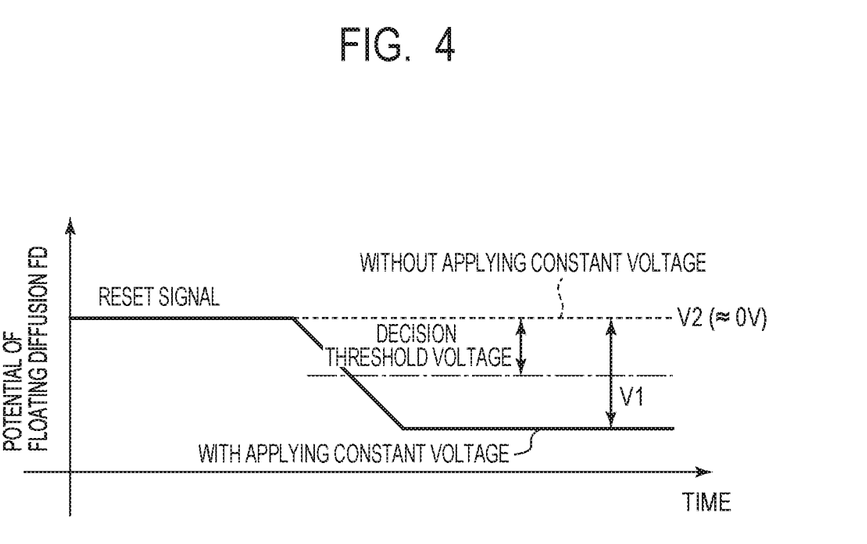
FIG. 4 is a diagram illustrating a failure detection method in the photoelectric conversion device according to the first embodiment of the present invention.

A photoelectric conversion device according to the first embodiment of the present invention will be described with reference to FIG. 1 to FIG. 4. FIG. 1 is a diagram illustrating a general configuration of a photoelectric conversion device according to the present embodiment. FIG. 2 is a circuit diagram illustrating a configuration example of pixels of the photoelectric conversion device according to the present embodiment. FIG. 3 is a timing diagram illustrating a method of driving the photoelectric conversion device according to the present embodiment. FIG. 4 is a diagram illustrating a failure detection method in the photoelectric conversion device according to the present embodiment.

First, the structure of the photoelectric conversion device according to the present embodiment will be described with reference to FIG. 1 and FIG. 2.

As illustrated in FIG. 1, a photoelectric conversion device 100 according to the present embodiment includes a pixel array 10, a vertical scanning circuit 30, a readout circuit 40, a voltage supply unit 50, a horizontal scanning circuit 60, an output circuit 70, and a control circuit 80.

The pixel array 10 includes a first region 12 and a second region 14. In the first region 12, a plurality of pixels 20A used for image acquisition are arranged over a plurality of rows and a plurality of columns. In the second region 14, a plurality of pixels 20B used for failure detection are arranged over a plurality of rows and a plurality of columns. The first region 12 and the second region 14 are arranged adjacent to each other in a first direction (the horizontal direction in FIG. 1), and while a row on which the pixel 20A is arranged and a row on which the pixel 20B is arranged are the same, a column on which the pixel 20A is arranged and a column on which the pixel 20B is arranged are different. The number of rows and the number of columns forming each region are not particularly limited. Note that the first direction may be referred to as a row direction or the horizontal direction.

On each row of the pixel array 10, a control line 22 extending in a first direction is arranged. The control line 22 on each row is connected to the pixels 20A and the pixels 20B belonging to the corresponding row to form a signal line common thereto. The control line 22 is connected to the vertical scanning circuit 30.

On each column of the pixel array 10, an output line 24 extending in a second direction (the vertical direction in FIG. 1) intersecting the first direction is arranged. The output line 24 on each column is connected to the pixels 20A or the pixels 20B belonging to the corresponding column to form a signal line common thereto. The output line 24 is connected to the readout circuit 40. Note that, in this specification, an output line connected to the pixel 20A may be denoted as the output line 24A, and an output line connected to the pixel 20B may be denoted as the output line 24B. Further, the second direction may be referred to as a column direction or the vertical direction.

On each column of the second region 14 of the pixel array 10, a voltage supply line 26 extending in the second direction is arranged. The voltage supply line 26 on each column is connected to the pixels 20B belonging to the corresponding column to form a signal line common thereto. The voltage supply line 26 is connected to the voltage supply unit 50.

The vertical scanning circuit 30 supplies, to the pixels 20A or the pixels 20B, predetermined control signal for driving these pixels via the control line 22. The vertical scanning circuit 30 may be formed of a logic circuit such as a shift register or an address decoder. While the control line 22 on each row is illustrated as one signal line in FIG. 1, each of the control line 22 practically includes a plurality of signal lines. The pixels 20A and 20B on a row selected by the vertical scanning circuit 30 operate so as to simultaneously output a signal to the corresponding output line 24, respectively.

The readout circuit 40 includes a plurality of column amplifier circuits 42 in accordance with the number of columns of the pixel array 10 (see FIG. 2). Each of the column amplifier circuit 42 is connected to the output line 24 on each column. Each of the readout circuits 40 amplifies a pixel signal output to the output line 18 on each column at the column amplifier circuit 42 on each column. Further, the readout circuit 40 performs a correlated double sampling (CDS) process based on a reset signal and a photoelectric conversion signal on a pixel signal output from the pixel 20A. A CDS process based on a reset signal and a signal from the voltage supply line 26 at the time of voltage input is performed on a pixel signal output from the pixel 20B. Note that, in this specification, a column amplifier circuit 42 connected to the output line 24A may be denoted as a column amplifier circuit 42A, and a column amplifier circuit 42 connected to the output line 24B may be denoted as a column amplifier circuit 42B.

The horizontal scanning circuit 60 supplies, to the readout circuit 40, a control signal used for transferring pixel signals processed in the readout circuit 40 to the output circuit 70 sequentially on a column basis.

The output circuit 70 is formed of a buffer amplifier, a differential amplifier, or the like and outputs a pixel signal transferred from the readout circuit 40 to a signal processing unit (not illustrated) outside the photoelectric conversion device 100. Note that the readout circuit 40 or the output circuit 70 may be provided with an analog-to-digital (AD) conversion unit and configured to externally output a digital pixel signal.

The voltage supply unit 50 is a power supply circuit that supplies a predetermined voltage (voltage Vref) to the pixel 20B via the voltage supply line 26.

The control circuit 80 is a circuit unit that supplies, to the vertical scanning circuit 30, the readout circuit 40, the voltage supply unit 50, and the horizontal scanning circuit 60, the control signal used for controlling the operations or the timings thereof. Some or all of these control signals supplied to the vertical scanning circuit 30, the readout circuit 40, the voltage supply unit 50, and the horizontal scanning circuit 60 may be supplied from the outside of the photoelectric conversion device 100.

FIG. 2 is a circuit diagram illustrating a configuration example of the pixel 20A arranged in the first region 12 and the pixel 20B arranged in the second region 14. In FIG. 2, one pixel 20A and one pixel 20B belonging to the same row are extracted and illustrated out of the plurality of pixels 20A and 20B forming the pixel array 10.

The pixel 20A includes a photoelectric converter DA, a transfer transistor M1A, a reset transistor M2A, an amplifier transistor M3A, and a select transistor M4A. The photoelectric converter DA is a photodiode, for example. The photodiode of the photoelectric converter DA has the anode connected to a reference voltage node GND and the cathode connected to the source of the transfer transistor M1A. The drain of the transfer transistor M1A is connected to the source of the reset transistor M2A and the gate of the amplifier transistor M3A. The connection node of the drain of the transfer transistor M1A, the source of the reset transistor M2A, and the gate of the amplifier transistor M3A is a so-called floating diffusion portion FD. A parasitic capacitance component (FD capacitor CfdA) created between the floating diffusion portion FD and another wiring or a diffusion region has a function as a charge holding unit. The capacitance is illustrated by a capacitor C1A connected to the floating diffusion portion FD in FIG. 2. The drain of the reset transistor M2A and the drain of the amplifier transistor M3A are connected to a pixel power supply line 28A (voltage Vdd_A). The pixel power supply line 28A is the node that supplies the voltage Vdd_A. The source of the amplifier transistor M3A is connected to the drain of the select transistor M4A. The source of the select transistor M4A is connected to the output line 24A.

The pixel 20B includes a photoelectric converter DB, a transfer transistor M1B, a reset transistor M2B, an amplifier transistor M3B, and a select transistor M4B. The photoelectric converter DB is a photodiode, for example. The photodiode of the photoelectric converter DB has the anode connected to the reference voltage node GND and the cathode connected to the source of the transfer transistor M1B and the voltage supply line 26. The voltage supply line 26 is the node to which a predetermined voltage is supplied. The drain of the transfer transistor M1B is connected to the source of the reset transistor M2B and the gate of the amplifier transistor M3B. The connection node of the drain of the transfer transistor M1B, the source of the reset transistor M2B, and the gate of the amplifier transistor M3B is the floating diffusion portion FD. A parasitic capacitance component (FD capacitor CfdB) created between the floating diffusion portion FD and another wiring or a diffusion region is illustrated by a capacitor C1B in FIG. 2. The drain of the reset transistor M2B and the drain of the amplifier transistor M3B are connected to a pixel power supply line 28B (voltage Vdd_B). The pixel power supply line 28B is the node that supplies the voltage Vdd_B. The source of the amplifier transistor M3B is connected to the drain of the select transistor M4B. The source of the select transistor M4B is connected to the output line 24B.

In such a way, the pixel 20B is the same as the pixel 20A in view of a circuit configuration except that the voltage supply line 26 is connected to the connection node between the photoelectric converter DB and the transfer transistor M1B. Note that the second region 14, that is, the pixel 20B is covered with a light shielding film (not illustrated). The pixel 20B is not necessarily required to have the photoelectric converter DB. In such a case, in particular, the transfer transistor M1B of the pixel 20B is not necessarily intended for charge transfer but is a corresponding transistor that is driven simultaneously with the transfer transistor M1A of the pixel 20A and thus may be here referred to as "transfer transistor" for the purpose of illustration.

In the case of the pixel configuration in FIG. 2, the control line 22 arranged on each row includes signal lines TX, RES, and SEL. The signal line TX is connected to the gates of the transfer transistors M1A of the pixels 20A and the gates of the transfer transistors M1B of the pixels 20B belonging to the corresponding row, respectively. The signal line RES is connected to the gates of the reset transistors M2A of the pixels 20A and the gates of the reset transistors M2B of the pixels 20B belonging to the corresponding row, respectively. The signal line SEL is connected to the gates of the select transistors M4A of the pixels 20A and the gates of the select transistors M4B of the pixels 20B belonging to the corresponding row, respectively. The pixels 20A and the pixels 20B arranged on the same row are simultaneously driven in accordance with a common control signal supplied to the control line 22.

A control signal ϕTX that includes drive pulses for controlling the transfer transistors M1A and M1B is output from the vertical scanning circuit 30 to the signal line TX. A control signal ϕRES that includes drive pulses for controlling the reset transistors M2A and M2B is output from the vertical scanning circuit 30 to the signal line RES. A control signal ϕSEL that includes drive pulses for controlling the select transistors M4A and M4B is output from the vertical scanning circuit 30 to the signal line SEL. The common control signals ϕTX, ϕRES, and ϕSEL are supplied from the vertical scanning circuit 30 to the pixels 20A and the pixels 20B that are arranged on the same row. When each transistor is formed of an n-channel transistor, the corresponding transistor is turned on when the control signal at a high level is supplied from the vertical scanning circuit 30, and the corresponding transistor is turned off when the control signal at a low level is supplied from the vertical scanning circuit 30.

The photoelectric converter DA converts (photoelectrically converts) an incident light to an amount of charge in accordance with the light amount and accumulates the generated charge. When turned on, the reset transistor M2A resets the floating diffusion portion FD to a voltage in accordance with the voltage Vdd_A. Further, when turned on, the transfer transistor M1A transfers charge held in the photoelectric converter DA to the floating diffusion portion FD. Accordingly, the floating diffusion portion FD has a voltage in accordance with the amount of the charge transferred from the photoelectric converter DA by charge-to-voltage conversion due to the FD capacitor CfdA. The amplifier transistor M3A is configured such that the voltage Vdd_A is supplied to the drain and a bias current is supplied to the source from the current source (not illustrated) via the select transistor M4A and the output line 24A. Thereby, the amplifier transistor M3A forms an amplifier unit whose gate is the input node (source follower circuit). Thereby, the amplifier transistor M3A outputs a signal in accordance with the voltage of the floating diffusion portion FD to the output line 24A via the select transistor M4A. The pixel signal output to the output line 24A is amplified at a predetermined gain in the column amplifier circuit 42A of the readout circuit 40 and output from the column amplifier circuit 42A.

When turned on, the reset transistor M2B resets the floating diffusion portion FD to a voltage in accordance with the voltage Vdd_B. When turned on, the transfer transistor M1B applies a voltage supplied from the voltage supply line 26 to the floating diffusion portion FD. The amplifier transistor M3B is configured such that the voltage Vdd_B is supplied to the drain and a bias current is supplied to the source from the current source (not illustrated) via the select transistor M4B and the output line 24B. Thereby, the amplifier transistor M3B forms an amplifier unit whose gate is the input node (source follower circuit). Thereby, the amplifier transistor M3B outputs a signal in accordance with the voltage of the floating diffusion portion FD to the output line 24B via the select transistor M4B. The pixel signal output to the output line 24B is amplified at a predetermined gain in the column amplifier circuit 42B of the readout circuit 40 and is output from the column amplifier circuit 42B.

Next, a method of driving the photoelectric conversion device according to the present embodiment will be described with reference to FIG. 3.

FIG. 3 illustrates the control signal ϕRES for the reset transistors M2A and M2B, the control signal ϕSEL for the select transistors M4A and M4B, and the control signal ϕTX for the transfer transistors M1A and M1B. When these control signals are at the high level, the corresponding transistors are in an on-state, and when these control signals are at the low level, the corresponding transistors are in an off-state. Each control signal is supplied from the vertical scanning circuit 30 under the control of the control circuit 80. Further, FIG. 3 illustrates a potential OUT1A of the output line 24A, a potential OUT1B of the output line 24B, a potential OUT2A of the output signal from the column amplifier circuit 42A, and a potential OUT2B of the output signal from the column amplifier circuit 42B.

At time t0, the control signal ϕRES supplied from the vertical scanning circuit 30 is at the high level, and the reset transistor M2A of the pixel 20A and the reset transistor M2B of the pixel 20B are in the on-state. Thereby, the floating diffusion portion FD of the pixel 20A has been reset to a potential in accordance with a reset voltage (voltage Vdd_A) supplied from the pixel power supply line 28A. Further, the floating diffusion portion FD of the pixel 20B has been reset to a potential in accordance with a reset voltage (voltage Vdd_B) supplied from the pixel power supply line 28B.

Further, at time t0, the control signal ϕSEL supplied from the vertical scanning circuit 30 is at the low level, and the select transistor M4A of the pixel 20A and the select transistor M4B of the pixel 20B are in the off-state. Thus, a signal in accordance with the potential of the floating diffusion portion FD of the pixel 20A is not output to the output line 24A. Further, a signal in accordance with the potential of the floating diffusion portion FD of the pixel 20B is not output to the output line 24B.

Next, at time t1, the vertical scanning circuit 30 controls the control signal ϕSEL from the low level to the high level. Thereby, the select transistor M4A of the pixel 20A and the select transistor M4B of the pixel 20B are turned on. This operation causes the potential OUT1A of the output line 24A to become a potential in accordance with the potential of the floating diffusion portion FD of the pixel 20A. Further, the potential OUT1B of the output line 24B becomes a potential in accordance with the potential of the floating diffusion portion FD of the pixel 20B.

Next, at time t2, the vertical scanning circuit 30 controls the control signal ORES from the high level to the low level. Thereby, the reset transistor M2A of the pixel 20A and the reset transistor M2B of the pixel 20B are turned off. This operation causes a reset state of the floating diffusion portion FD of the pixel 20A and the floating diffusion portion FD of the pixel 20B to be released. At this time, the potentials OUT1A and OUT1B also decrease by a certain amount due to the reduction in the potential of the floating diffusion portion FD of the pixel 20A and the floating diffusion portion FD of the pixel 20B due to the gate-source coupling of the reset transistors M2A and M2B.

Next, in the period from time t3 to time t4, the vertical scanning circuit 30 controls the control signal ϕTX from the low level to the high level. Thereby, in the period from time t3 to time t4, the transfer transistor M1A of the pixel 20A and the transfer transistor M1B of the pixel 20B are in the on-state. This operation causes charge accumulated in the photoelectric converter DA of the pixel 20A to be transferred to the floating diffusion portion FD, the potential in the floating diffusion portion FD then changes, and the potential OUT1A of the output line 24A decreases to a potential in accordance with the changed potential of the floating diffusion portion FD. The signal amplitude of an output signal at this time is denoted as sig1A. Further, the potential in the floating diffusion portion FD of the pixel 20B changes to a potential in accordance with a constant voltage supplied from the voltage supply line 26, and a potential OUT1B of the output line 24B decreases to a potential in accordance with the changed potential of the floating diffusion portion FD. The signal amplitude of an output signal at this time is denoted as sig1B.

A signal output to the output line 24A is amplified by the column amplifier circuit 42A, and the potential OUT2A of an output signal from the column amplifier circuit 42A increases to a potential in accordance with the amplification factor of the column amplifier circuit 42A. The signal amplitude of an output signal on and after time t4 is denoted as sig2A.

Further, a signal output to the output line 24B is amplified by the column amplifier circuit 42B, and the potential OUT2B of an output signal from the column amplifier circuit 42B increases to a potential in accordance with the amplification factor of the column amplifier circuit 42B. The signal amplitude of an output signal on and after time t4 is denoted as sig2B.

In the photoelectric conversion device according to the present embodiment, a failure decision is performed based on the signal amplitude sig2B of an output signal of the pixel 20B.

Next, a failure detection method in the photoelectric conversion device according to the present embodiment will be described with reference to FIG. 4. Note that the failure decision of the photoelectric conversion device may be performed on a digital front end (DFE) inside the photoelectric conversion device after a pixel signal is converted into a digital signal in the photoelectric conversion device, or may be performed outside photoelectric conversion device. Alternatively, an analog signal is output from the photoelectric conversion device, and the failure decision may then be performed outside the photoelectric conversion device.

FIG. 4 is a diagram illustrating a potential change of the floating diffusion portion FD in a course of readout of a signal from the pixel 20B. FIG. 4 schematically illustrates a view of a potential change of the floating diffusion portion FD caused by supplying a voltage from the voltage supply line 26 to the floating diffusion portion FD that is in a reset state.

In a signal output from the pixel 20B, the output voltage when a CDS process is performed is set to voltage V1, and this CDS process is based on a reset signal obtained when the floating diffusion portion FD is in a reset state and on an output signal obtained when a predetermined constant voltage is supplied from the voltage supply line 26 to the floating diffusion portion FD. Further, the output voltage when a CDS process is performed is set to voltage V2, and this CDS process is based on a reset signal obtained when the floating diffusion portion FD is in a reset state and on an output signal obtained when the constant voltage is not supplied from the voltage supply line 26 to the floating diffusion portion FD (that is, an output signal at the same level as the reset signal). A decision threshold voltage used as a reference for a failure decision is set to a voltage close to the middle between the voltage V1 and the voltage V2. For example, when the reset voltage is 2.8 V and the constant voltage is 1.6 V, the voltage V1 is 1.2 V and the voltage V2 is 0 V under ideal conditions. Therefore, the decision threshold voltage is set to 0.6 V, which is an intermediate value between the voltage V1 and the voltage V2. When the voltage obtained after the constant voltage is input exceeds the decision threshold, it is decided that there is no failure, and when the voltage obtained after the constant voltage is input does not exceed the decision threshold, it is decided that there is a failure.

The failure decision is performed by determining whether or not the voltage V1 exceeds the decision threshold voltage in the pixel 20B that supplies a predetermined constant voltage. That is, when the voltage V1 does not exceed the decision threshold voltage, it is decided that there is a failure, and when the voltage V1 exceeds the decision threshold voltage, it is decided that there is no failure. In the above example, as a result of performing the CDS process after inputting the constant voltage, when the value of the voltage V1 is 0.2 V, the decision threshold voltage is not exceeded, and it is thus decided that there is a failure. On the other hand, when the value of the voltage V1 is 1.0 V, the decision threshold voltage is exceeded, and it is thus decided that there is no failure. Since the output signal from the pixel 20B is output through the same transmission path as the output signal from the pixel 20A, when it is decided that there is a failure, it can be estimated that the failure is in the output signal transmission path or the control line 22 or the like.

When a potential difference between the gate electrode of the transfer transistor M1 and the floating diffusion portion FD is large, the potential of the floating diffusion portion FD may fluctuate due to occurrence of leakage of charge to the floating diffusion portion FD. Such leakage of charge may be caused by a reduction in the insulating properties of a gate insulating film due to defects introduced in the gate insulating film of the transfer transistor M1 by film fatigue during manufacture or use, for example.

For example, at time t2, the control signal ϕTX is at the low level, a potential difference between the gate electrode of the transfer transistor M1A and the floating diffusion portion FD in the pixel 20A and a potential difference between the gate electrode of the transfer transistor M1B and the floating diffusion portion FD in the pixel 20B are large. Thus, when there is a defect described above on the gate insulating film of the transfer transistor M1A or M1B, charge may flow into the floating diffusion portion FD from the gate electrode side of the transfer transistor M1A or M1B, and the potential of the floating diffusion portion FD may increase. Further, even when there is initially no defect on the gate insulating film of the transfer transistor M1A or M1B, the gate insulating film gradually deteriorates by a use under a high electrical field, and a defect that causes leakage of charge may be introduced.

Since a failure decision performed in the pixel 20B is performed based on the potential of the floating diffusion portion FD of the pixel 20B as described above, when the potential of the floating diffusion portion FD varies, this may cause an erroneous failure decision. Thus, in the pixel 20B used for failure detection, it is desirable that the reset voltage of the floating diffusion portion FD be relatively low. On the other hand, in the pixel 20A used for image detection, a reduction in a reset voltage of the floating diffusion portion FD leads to a reduction in the dynamic range. Thus, in the pixel 20A used for image detection, it is desirable that the reset voltage of the floating diffusion portion FD be relatively high.

In terms of the above, the present embodiment is configured such that the amplitude of the voltage Vfd_B when the floating diffusion portion FD of the pixel 20B is reset so as to be lower than the amplitude of the voltage Vfd_A when the floating diffusion portion FD of the pixel 20A is reset.

Specifically, when a voltage supplied to the pixel power supply line 28A is Vdd_A, and a voltage supplied to the pixel power supply line 28B is Vdd_B, the voltage Vdd_A and the voltage Vdd_B are configured to have the following relationship.

$$Vdd\_A > Vdd\_B$$

For example, the voltage Vdd_A is around 2.3 V, and the voltage Vdd_B is around 2.5 V.

With such a configuration, immediately after time t2, the voltage Vfd_A when the floating diffusion portion FD of the pixel 20A is reset and the voltage Vfd_B when the floating diffusion portion FD of the pixel 20B is reset have the following relationship.

$$Vfd\_A > Vfd\_B$$

For example, the voltage Vfd_A is around 3.2 V, and the voltage Vfd_B is around 2.4 V.

Accordingly, an erroneous decision of failure detection based on a signal obtained from the pixel 20B can be reduced without a reduction in the dynamic range of a signal obtained from the pixel 20A.

In such a way, according to the present embodiment, it is possible to reduce an error in the failure decision caused by a defect or deterioration of a pixel used for failure detection.

The voltage Vref described in the present embodiment can be changed to various values. For example, the voltage Vref supplied in a certain period may be a voltage corresponding to the power supply voltage of the pixel (around 3 V), and the voltage Vref supplied in a certain period may be the ground voltage (around 0 V). Such a change includes an example in which the voltage Vref is set to a voltage corresponding to the power supply voltage of the pixel in one frame and the voltage Vref is set to the ground voltage in another frame.

Further, in the present embodiment, the case where charge accumulated in the photoelectric converter DA by photoelectric conversion are electrons has been described. As another example, the photoelectric converter DA may accumulate holes by photoelectric conversion. In such a case, the voltages Vfd_A and Vfd_B when the floating diffusion portion FD is reset have the following relationship.

$$Vfd\_A < Vfd\_B$$

For example, the voltage Vfd_A is around −3.2 V, and the voltage Vfd_B is around −2.4 V. Also in such a case, it can be said that the amplitude of the voltage Vfd_B is smaller than the amplitude of the voltage Vfd_A.

Note that the reference potential used as a reference for the amplitude of the voltages Vfd_A and Vfd_B mentioned in the present embodiment may be a potential obtained when the floating diffusion portion FD holds charge in accordance with the saturated charg amount. Practically, the ground potential can be the reference potential.

Second Embodiment

Figure 5:
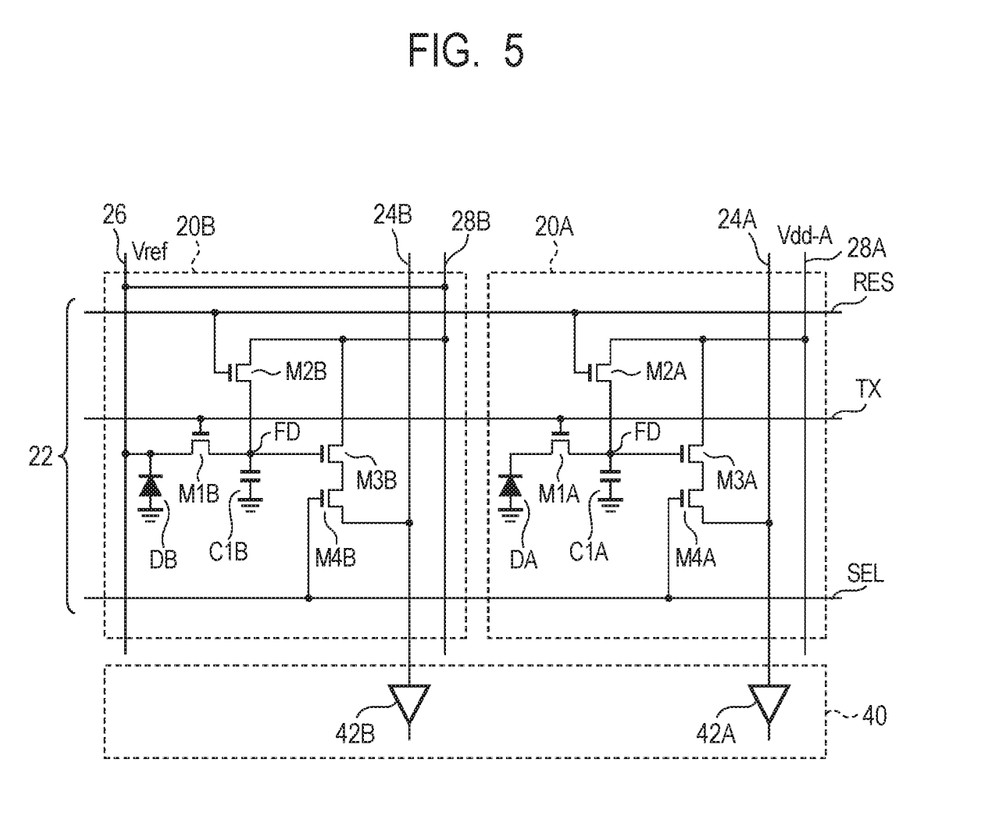
FIG. 5 is a circuit diagram illustrating a configuration example of pixels of the photoelectric conversion device according to a second embodiment of the present invention.

A photoelectric conversion device and a method of driving the same according to a second embodiment of the present invention will be described with reference to FIG. 5. The same components as those of the photoelectric conversion device according to the first embodiment are labeled with the same references, and the description thereof will be omitted or simplified. FIG. 5 is a circuit diagram illustrating a configuration example of pixels of the photoelectric conversion device according to the present embodiment.

In the present embodiment, another configuration example in which the voltage Vfd_B obtained when the floating diffusion portion FD of the pixel 20B is reset is set to a voltage that is lower than the voltage Vfd_A obtained when the floating diffusion portion FD of the pixel 20A is reset will be described.

As illustrated in FIG. 5, in the photoelectric conversion device according to the present embodiment, the voltage supply line 26 is connected to the pixel power supply line 28B. That is, the voltage Vref is supplied from the voltage supply unit 50 to the pixel power supply line 28B. Other features are the same as those of the photoelectric conversion device according to the first embodiment illustrated in FIG. 1 and FIG. 2.

The voltage Vref is set to a lower voltage than the voltage Vdd_A supplied to the pixel power supply line 28A. Accordingly, by supplying the voltage Vref to the pixel power supply line 28B, immediately after time t2, the voltage Vfd_A when the floating diffusion portion FD of the pixel 20A is reset and the voltage Vfd_B when the floating diffusion portion FD of the pixel 20B is reset have the following relationship.

$$Vfd\_A > Vfd\_B$$

Accordingly, an erroneous decision of failure detection based on a signal obtained from the pixel 20B can be reduced without a reduction in the dynamic range of a signal obtained from the pixel 20A.

As described above, according to the present embodiment, it is possible to reduce an error in the failure decision caused by a defect or deterioration of a pixel used for failure detection.

Third Embodiment

A photoelectric conversion device and a method of driving the same according to a third embodiment of the present invention will be described with reference to FIG. 2. The same components as those of the photoelectric conversion device according to the first embodiment are labeled with the same references, and the description thereof will be omitted or simplified.

In the present embodiment, another configuration example in which the voltage Vfd_B obtained when the floating diffusion portion FD of the pixel 20B is reset is set to a voltage that is lower than the voltage Vfd_A obtained when the floating diffusion portion FD of the pixel 20A is reset will be described.

In the present embodiment, a threshold voltage Vth_resA of the reset transistor M2A of the pixel 20A is different from a threshold voltage Vth_resB of the reset transistor M2B of the pixel 20B. Specifically, the threshold voltage Vth_resA and the threshold voltage Vth_resB are configured to have the following relationship.

Vth_resB>Vth_resA

Further, in the present embodiment, the voltage Vdd_A supplied to the pixel power supply line 28A and the voltage Vdd_B supplied to the pixel power supply line 28B are configured to have the following relationship.

Vdd_A=Vdd_B

With such a configuration, immediately after time t2, the voltage Vfd_A when the floating diffusion portion FD of the pixel 20A is reset and the voltage Vfd_B when the floating diffusion portion FD of the pixel 20B is reset have the following relationship.

Vfd_A>Vfd_B

Accordingly, an erroneous decision of failure detection based on a signal obtained from the pixel 20B can be reduced without a reduction in the dynamic range of a signal obtained from the pixel 20A.

The threshold voltage of the reset transistor M2 can be appropriately changed by changing the size, the channel impurity concentration, or the like of a transistor. For example, the gate width of the reset transistor M2A is made wider than the gate width of the reset transistor M2B. Alternatively, the gate length of the reset transistor M2A is made shorter than the gate length of the reset transistor M2B. Alternatively, when the reset transistor M2 is formed of an n-channel transistor, the n-type impurity concentration in the channel region of the reset transistor M2A is made higher than the n-type impurity concentration in the channel region of the reset transistor M2B. Any combination of the above may be employed. With the above change, the threshold voltage Vth_resA can be made lower than the threshold voltage Vth_resB.

Note that, while the voltage Vdd_A supplied to the pixel power supply line 28A and the voltage Vdd_B supplied to the pixel power supply line 28B are set to the same voltage in the present embodiment, these voltages may be set to different values as long as the relationship of Vfd_A>Vfd_B can be maintained.

As described above, according to the present embodiment, it is possible to reduce an error of a failure decision caused by a defect or deterioration of a pixel used for failure detection.

Fourth Embodiment

A photoelectric conversion system and a movable object according to a fourth embodiment of the present invention will be described with reference to FIG. 6A to FIG. 7.

Figure 6A:
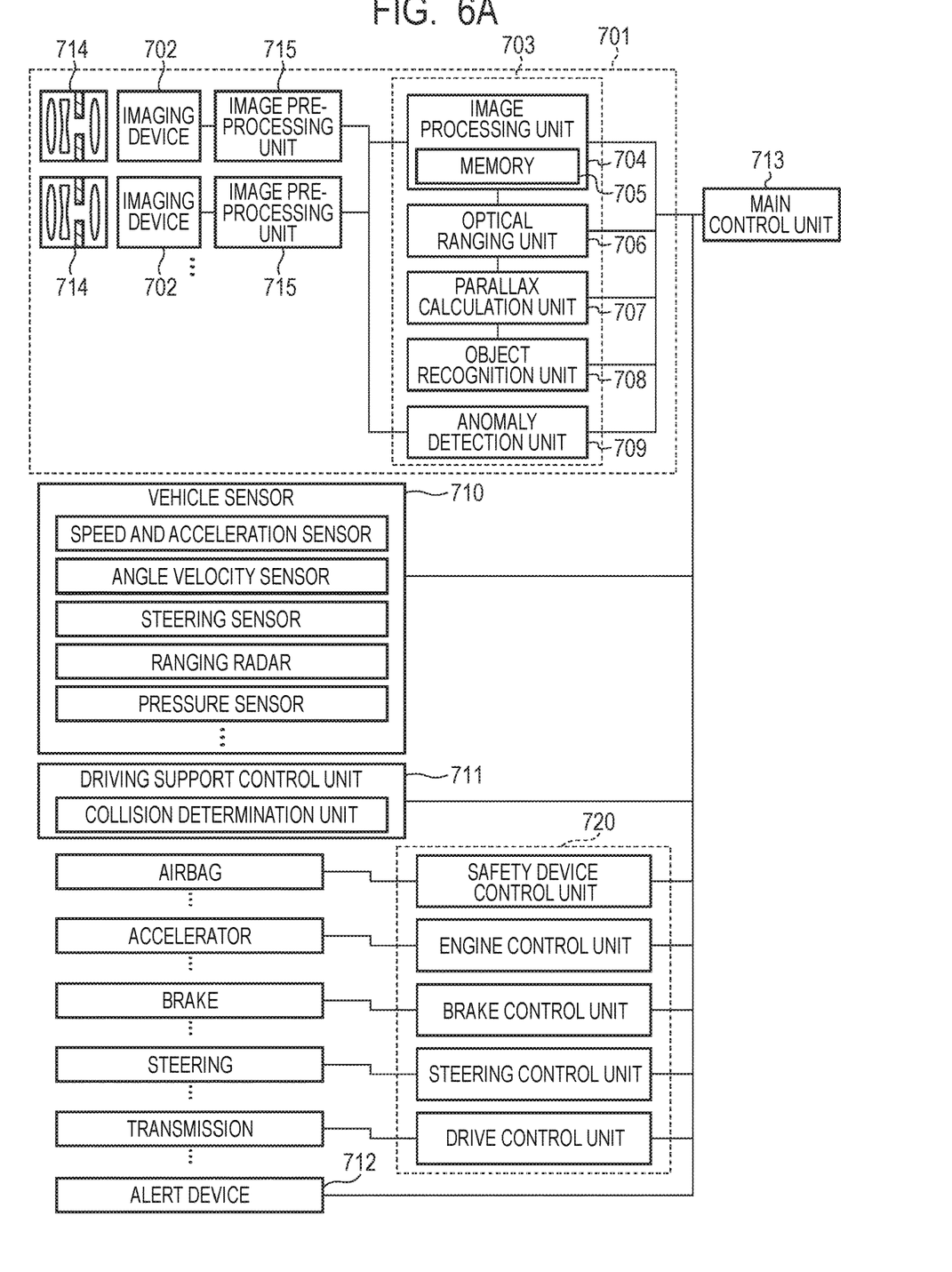
FIG. 6A is a schematic diagram illustrating a configuration example of a photoelectric conversion system according to a fourth embodiment of the present invention.
Figure 6B:
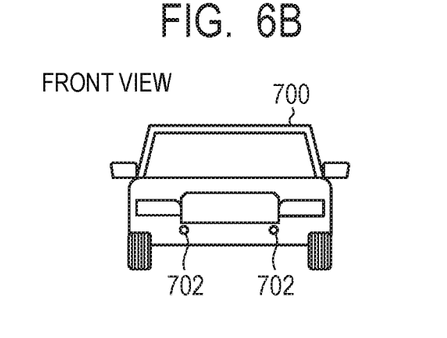
FIG. 6B, FIG. 6C, and FIG. 6D are schematic diagrams illustrating a configuration example of a movable object according to the fourth embodiment of the present invention.
Figure 6C:
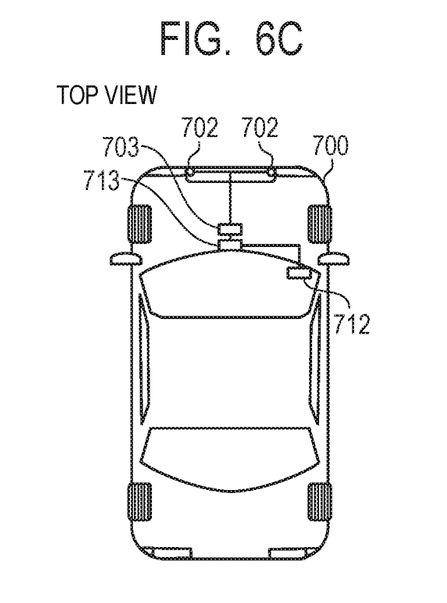
Figure 6D:
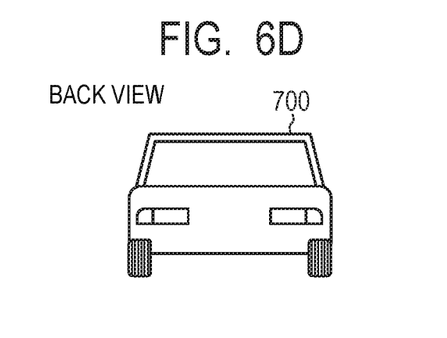
Figure 7:
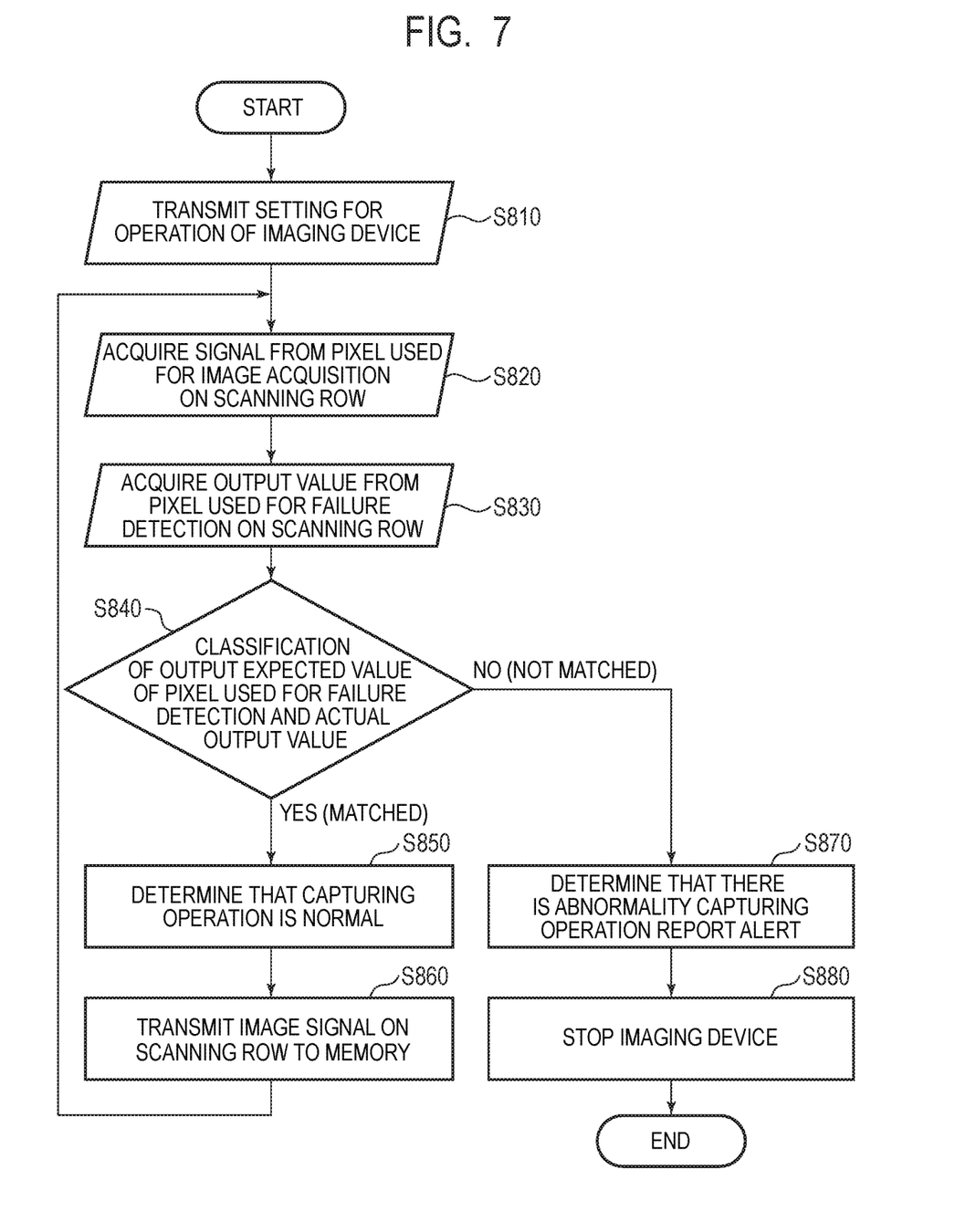
FIG. 7 is a flow diagram illustrating an operation of the photoelectric conversion system according to the fourth embodiment of the present invention.

FIG. 6A is a schematic diagram illustrating a configuration example of a photoelectric conversion system according to the present embodiment. FIG. 6B, FIG. 6C, and FIG. 6D are schematic diagrams illustrating the configuration example of the photoelectric conversion system and the movable object according to the present embodiment. FIG. 7 is a flowchart illustrating the operation of the photoelectric conversion system according to the present embodiment.

In the present embodiment, an example of a photoelectric conversion system related to an on-vehicle camera will be illustrated. FIG. 6A illustrates an example of a vehicle system and a photoelectric conversion system mounted thereon. A photoelectric conversion system 701 includes imaging devices 702, image preprocessing units 715, an integrated circuit 703, and optical systems 714. Each of the optical systems 714 captures an optical image of an object on the imaging device 702. Each of the imaging devices 702 converts an optical image of an object captured by the optical system 714 into an electrical signal. Each of the imaging devices 702 is the photoelectric conversion device of any of the first to third embodiments described above. Each of the image preprocessing units 715 performs predetermined signal processing on a signal output from the imaging device 702. The function of the image preprocessing unit 715 may be embedded in the imaging device 702. The photoelectric conversion system 701 is provided with at least two sets of the optical system 714, the imaging device 702, and the image preprocessing unit 715, and the output from the image preprocessing units 715 of respective sets is input to the integrated circuit 703.

The integrated circuit 703 is an integrated circuit specific to application of the photoelectric conversion system and includes an image processing unit 704 including a memory 705, an optical ranging unit 706, a parallax calculation unit 707, an object recognition unit 708, and an anomaly detection unit 709. The image processing unit 704 performs image processing such as development process, defection correction, or the like on the output signal from the image preprocessing unit 715. The memory 705 stores primary storage of a captured image or a defection position of a captured image. The optical ranging unit 706 performs focusing or ranging of an object. The parallax calculation unit 707 calculates a parallax (a phase difference of parallax images) from a plurality of image data acquired by the plurality of imaging devices 702. The object recognition unit 708 recognizes an object such as an automobile, a road, a traffic sign, a person, or the like. In response to detection of an anomaly of the imaging device 702, the anomaly detection unit 709 reports the anomaly to a main control unit 713.

The integrated circuit 703 may be implemented by dedicatedly designed hardware, may be implemented by a software module, or may be implemented by the combination thereof. Further, the integrated circuit 703 may be implemented by a Field Programmable Gate Array (FPGA), an Application Specific Integrated Circuit (ASIC), or the like or may be implemented by the combination thereof.

The main control unit 713 integrates and controls the operation of the photoelectric conversion system 701, a vehicle sensor 710, a control unit 720, or the like. Note that the embodiment may be configured such that the photoelectric conversion system 701, the vehicle sensor 710, and the control unit 720 may include separate communication interfaces without the main control unit 713 and transmit and receive control signals, respectively, via the communication network (for example, CAN specification).

The integrated circuit 703 has a function of transmitting a control signal and a setting value to the imaging device 702 in response to receiving the control signal from the main control unit 713 or by using a control unit of the integrated circuit 703.

The photoelectric conversion system 701 is connected to the vehicle sensor 710 and can sense a traveling state of the subject vehicle, such as a vehicle speed, a yaw rate, a steering angle, or the like, and a state of an environment outside the subject vehicle or another vehicle and an obstacle. The vehicle sensor 710 also serves as a distance information acquisition unit that acquires information on the distance from the parallax image to the object. Further, the photoelectric conversion system 701 is connected to a drive support control unit 711 that performs various drive supports such as automatic steering, automatic patrol, collision prevention function, or the like. In particular, with respect to the collision determination function, estimation of a collision and determination of a collision against another vehicle and an obstacle are performed based on the sensing result of the photoelectric conversion system 701 or the vehicle sensor 710. Thereby, drive support control unit 711 performs avoidance control when a collision is estimated or startup of a safety device at a collision.

Further, the photoelectric conversion system 701 is connected to an alert device 712 that issues an alert to a driver based on the determination result in a collision determination unit. For example, when the determination result of the collision determination unit indicates a high possibility of collision, the main control unit 713 performs vehicle control to avoid a collision or reduce damage by applying a break, moving back the accelerator pedal, suppressing the engine power, or the like. The alert device 712 performs an alert to a user by sounding an alert such as a sound, displaying alert information on a display unit such as a car navigation system, a meter panel, or the like, providing a vibration to a sheet belt or a steering wheel, or the like.

In the present embodiment, the surrounding area of the vehicle, for example, the area in front or rear is captured by the photoelectric conversion system 701. FIG. 6B, FIG. 6C, and FIG. 6D illustrate an arrangement example of the photoelectric conversion system 701 when the area in front of the vehicle is captured by the photoelectric conversion system 701. FIG. 6B is a front view of the vehicle, FIG. 6C is a top view of the vehicle, and FIG. 6D is a back view of the vehicle.

The two imaging devices 702 are arranged in the front of a vehicle 700. Specifically, in terms of acquisition of the distance information or determination of the possibility of collision between the vehicle 700 and an object to be captured, it is preferable to define the center line with respect to the traveling direction or the external shape (for example, the vehicle width) of the vehicle 700 as a symmetry axis and arrange the two imaging devices 702 in a symmetrical manner with respect to the symmetry axis. Further, it is preferable to arrange the imaging devices 702 so as not to block the driver's field of view when the driver views the status outside the vehicle 700 out of the driver seat. It is preferable to arrange the alert device 712 so as to be easily viewed by the driver.

Next, a failure detection operation of the imaging device 702 in the photoelectric conversion system 701 will be described with reference to FIG. 7. The failure detection operation of the imaging device 702 is performed in accordance with steps S810 to S880 illustrated in FIG. 7.

Step S810 is a step of performing a setting when the imaging device 702 is started up. That is, a setting used for the operation of the imaging device 702 is transmitted from the outside of the photoelectric conversion system 701 (for example, from the main control unit 713) or from the inside of the photoelectric conversion system 701, and a capture operation and a failure detection operation of the imaging device 702 are started.

Next, in step S820, signals are acquired from the pixels 20A of the first region 12 belonging to a scanning row. Further, in step S830, output values are acquired from the pixels 20B of the second region 14 belonging to a scanning row. Note that step S820 and step S830 may be performed in opposite order.

Next, in step S840, classification as to whether or not the expected output value of the pixel 20B and the actual output value are matched is performed. The expected output value in this step is a value that satisfies a predetermined relationship to a predetermined decision threshold. For example, in the example described with reference to FIG. 4, if the voltage V1 output from the pixel 20B exceeds the decision threshold voltage, it is decided that the expected output value of the pixel 20B and the actual output value are matched.

If the expected output value and the actual output value are matched as a result of the classification in step S840, the process proceeds to step S850, it is decided that the capture operation is normally performed, and the process proceeds to step S860. In step S860, pixel signals of a scanned row are transmitted to and temporarily stored in the memory 705. The process then returns to step S820 and continues the failure detection operation.

On the other hand, if the expected output value and the actual output value are not matched as a result of the classification in step S840, the process proceeds to step S870, it is decided that the capture operation has an anomaly, and an alert is reported to the main control unit 713 or the alert device 712. The alert device 712 causes a display unit to display that an anomaly has been detected. Then, in step S880, the imaging device 702 stops the operation thereof, and the operation of the photoelectric conversion system 701 ends.

Note that, while the example in which the flowchart is looped on a row basis has been illustrated in the present embodiment, the flowchart may be looped on a multiple-row basis, or the failure detection operation may be performed on a frame basis.

Further, although control for avoiding a collision to another vehicle has been described in the present embodiment, the embodiment is also applicable to automatic driving control for following another vehicle, automatic driving control for not going out of a traffic lane, or the like. Furthermore, the photoelectric conversion system 701 is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiment

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention. For example, in the first or second embodiment, the threshold voltage of the reset transistor M2B may be higher than the threshold voltage of the reset transistor M2A.

Further, while description has been provided assuming that the transistors of the pixels 20A and 20B are formed of n-channel transistors in the above first to third embodiments, the transistors of the pixels 20A and 20B may be formed of p-channel transistors. In such a case, the signal level of each of the drive signals in the above description will be opposite.

Further, the photoelectric conversion devices illustrated in the above first to third embodiments may also be used as a device intended for acquisition of an image, that is, a solid state imaging device. The application example of the photoelectric conversion device described in the present specification is not necessarily limited to a solid state imaging device. For example, in the case of application to a device intended for ranging as described in the above fourth embodiment, it is not necessarily required to output an image. In such a case, it can be said that such a device is a photoelectric conversion device that converts optical information into a predetermined electrical signal. A solid state imaging device is one of the photoelectric conversion devices.

Further, the photoelectric conversion system illustrated in the above fourth embodiment is an example of a photoelectric conversion system to which the photoelectric conversion device of the present invention may be applied, and a photoelectric conversion system to which the photoelectric conversion device of the present invention is applicable is not limited to the configuration illustrated in FIG. 6A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-002381, filed Jan. 10, 2019 which is hereby incorporated by reference herein in its entirety.

What is claimed is:

1. A photoelectric conversion device comprising:
a first pixel including a photoelectric converter configured to receive an incident light, a first transfer transistor, a first node to which charge is transferred from the photoelectric converter via the first transfer transistor, and a first reset transistor that includes one node connected to the first node and another node configured to be input a first power supply voltage and is configured to reset a voltage of the first node, and configured to output a first signal in accordance with a voltage of the first node;
a voltage supply line configured to supply a predetermined voltage;
a second pixel including a second transfer transistor, an amplifier transistor including a second node to which the predetermined voltage is supplied from the voltage supply line via the second transfer transistor, and a second reset transistor that includes one node connected to the second node and another node configured to be input a second power supply voltage different from the first power supply voltage and is configured to reset a voltage of the second node, and configured to output a second signal in accordance with a voltage of the second node;
a first control line connected to a gate of the first reset transistor and a gate of the second reset transistor; and
a second control line connected to a gate of the first transfer transistor and a gate of the second transfer transistor,
wherein the first reset transistor resets the first node to a first voltage based on the first power supply voltage,
wherein the second reset transistor resets the second node to a second voltage having a smaller amplitude than the first voltage, based on the second power supply voltage, and
wherein the amplifier transistor of the second pixel includes another node configured to be input the second power supply voltage.

2. The photoelectric conversion device according to claim 1, wherein the first reset transistor and the second reset transistor are simultaneously driven in accordance with a common control signal supplied to the first control line.

3. The photoelectric conversion device according to claim 2,
wherein the first node is connected to a node to which the first voltage is supplied via the first reset transistor, and
wherein the second node is connected to a node to which the second voltage is supplied via the second reset transistor.

4. The photoelectric conversion device according to claim 3, wherein the node to which the second voltage is supplied is a node to which the predetermined voltage is supplied.

5. The photoelectric conversion device according to claim 2, wherein a threshold voltage of the second reset transistor is higher than a threshold voltage of the first reset transistor.

6. The photoelectric conversion device according to claim 2, wherein the amplitude is an amplitude from a ground potential.

7. The photoelectric conversion device according to claim 2, wherein light is incident on the first pixel and the second pixel is shielded from light.

8. The photoelectric conversion device according to claim 1,
wherein the first node is connected to a node to which the first voltage is supplied via the first reset transistor, and
wherein the second node is connected to a node to which the second voltage is supplied via the second reset transistor.

9. The photoelectric conversion device according to claim 8, wherein the node to which the second voltage is supplied is a node to which the predetermined voltage is supplied.

10. The photoelectric conversion device according to claim 1, wherein a threshold voltage of the second reset transistor is higher than a threshold voltage of the first reset transistor.

11. The photoelectric conversion device according to claim 1, wherein the amplitude is an amplitude from a ground potential.

12. A photoelectric conversion system comprising:
the photoelectric conversion device according to claim 1; and
a signal processing unit that processes a signal output from the first pixel and the second pixel of the photoelectric conversion device.

13. The photoelectric conversion system according to claim 12 further comprising an anomaly detection unit that detects an anomaly of the photoelectric conversion device based on the second signal output from the second pixel.

14. A movable object comprising:
the photoelectric conversion device according to claim 1;
a distance information acquisition unit that acquires distance information on a distance to an object, from a parallax image based on signals output from the first pixel of the photoelectric conversion device; and
a control unit that controls the movable object based on the distance information.

15. The movable object according to claim 14 further comprising an anomaly detection unit that detects an anomaly of the photoelectric conversion device based on the second signal output from the second pixel of the photoelectric conversion device.

16. The photoelectric conversion device according to claim 1, wherein the predetermined voltage is input to the second node after resetting the second node by the second reset transistor to the second voltage.

17. The photoelectric conversion device according to claim 1,
wherein the first reset transistor resets the first node to the first voltage from a first time to a second time, and
wherein the second reset transistor resets the second node to the second voltage from the first time to the second time.

18. The photoelectric conversion device according to claim 1 further comprising a plurality of second pixels,
wherein the voltage supply line is connected to the plurality of second pixels.

19. The photoelectric conversion device according to claim 1,
wherein the first pixel includes an amplifier transistor having the first node, and
wherein the amplifier transistor of the first pixel includes another node configured to be input a power supply voltage different from the second power supply voltage.

20. The photoelectric conversion device according to claim 19, wherein the power supply voltage is the first power supply voltage.

* * * * *